United States Patent [19]

Sloan et al.

[11] Patent Number: 4,468,411
[45] Date of Patent: Aug. 28, 1984

[54] METHOD FOR PROVIDING ALPHA PARTICLE PROTECTION FOR AN INTEGRATED CIRCUIT DIE

[75] Inventors: James W. Sloan; Truoc T. Tran; Frank T. Jones, III, all of Austin, Tex.

[73] Assignee: Motorola, Inc., Schaumburg, Ill.

[21] Appl. No.: 365,724

[22] Filed: Apr. 5, 1982

[51] Int. Cl.³ .................... H01L 21/312; H01L 23/00
[52] U.S. Cl. ........................................... 427/8; 427/5; 427/82; 427/378; 427/379; 427/385.5; 427/96
[58] Field of Search .................. 427/5, 82, 96, 8, 378, 427/379, 385.5

[56] References Cited

U.S. PATENT DOCUMENTS 3,615,913 10/1971 Shaw ..................................... 427/82
3,682,698 8/1972 Palmer ................................. 427/82
4,323,405 4/1982 Uno ....................................... 427/5

FOREIGN PATENT DOCUMENTS 55-128851 10/1980 Japan .

OTHER PUBLICATIONS

Mukai, et al., "Planar Multilevel Interconnection Technology Employing a Polyimide", IEEE Journal of Solid State Circuits, vol. SC-13, No. 4, Aug. 1978.
Ward, "Alpha Particle Shield", IBM TDB, vol. 22, No. 4, p. 1398, Sep. 1979.

Primary Examiner—John D. Smith
Attorney, Agent, or Firm—Jeffrey Van Myers

[57] ABSTRACT

A controlled quantity of a liquid polyimide precursor compound is deposited on the active surface of an integrated circuit die which has been prepared for packaging, and thereafter cured using a two step curing process to develop a polyimide coating of sufficient thickness to provide alpha particle protection for the die once packaged.

12 Claims, 1 Drawing Figure

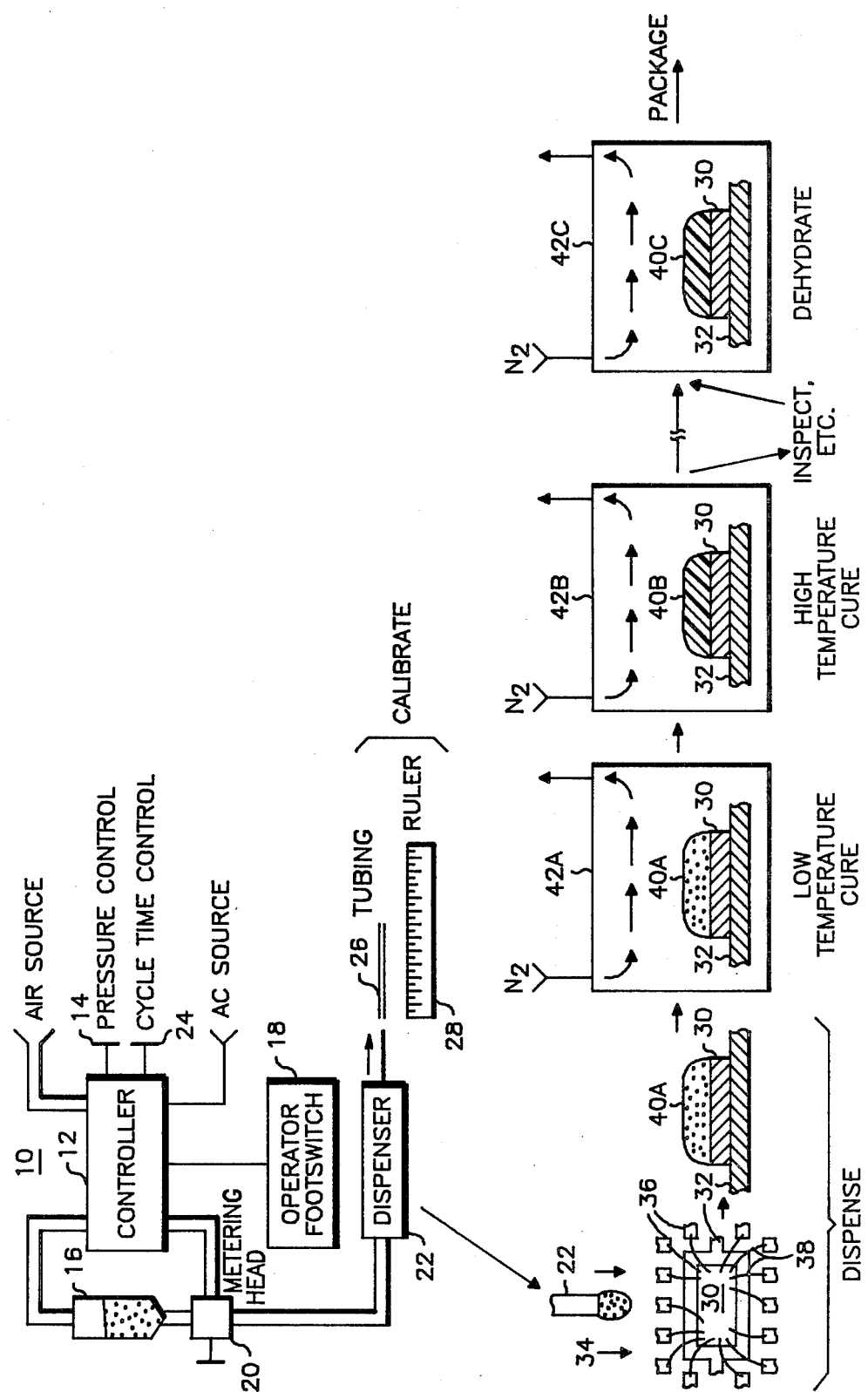

METHOD FOR PROVIDING ALPHA PARTICLE PROTECTION FOR AN INTEGRATED CIRCUIT DIE

BACKGROUND OF THE INVENTION

1. Field of the Invention

The subject invention relates generally to methods for providing alpha particle protection for integrated circuit die, and, in particular, to a method for providing alpha particle protection for an integrated circuit die prior to the plastic encapsulation thereof.

2. Description of the Prior Art

The phenomenon of charge carrier generation as a result of the passage of an alpha particle through the active surface of an integrated circuit die has been known for many years. However, the effects were generally considered to be laboratory curiosities prior to the advent of high density, dynamic MOS memories wherein the stored data is represented by the presence or absence of quantities of charge stored on capacitor portions of the storage cells. As improvements in fabrication processes allowed the shrinkage of the storage cells, the quantity of charge distinguishing a "zero" from a "one" shrank relative to the number of charge carriers generated by a typical alpha particle impact. In April of 1978, T. C. Mays and M. H. Woods with the physical analysis laboratory of Intel Corporation first reported the protection of "soft" errors induced by alpha particles in such dynamic memories. (*Proceedings of the 1978 International Reliability Physics Symposium;* see also "Alpha-Particle-Induced Soft Errors in Dynamic Memories," *I.E.E.E. Transactions on Electron Devices,* Vol. EE-26, January 1979).

Since 1978, efforts to prevent alpha particle induced errors in integrated circuits have focused on three approaches: (1) to design the circuitry, particularly charge storage cells, with sufficiently high operating margins to ensure that the quantity of charge carriers generated by even very energetic alpha particles will be insufficient to effect the logic state; (2) packaging the integrated circuit using materials having very low levels of radioactive impurities such as uranium and thorium; and (3) protecting the active surface of the integrated circuit with a material which absorbs the alpha particles before they reach the surface. A fourth alternative, not available to the integrated circuit manufacturer, is to provide an error detection and correction in the system in which the sensitive circuit is used. Since alternative 1 typically requires an increased charge storage capability, the resulting increase in die size will often be prohibitive. Alternative 2, while appearing to be the most advantageous, is very difficult to achieve and, with respect to plastic encapsulation, is presently unavailable due to the lack of any suitable filler material with sufficiently low levels of contaminants. As a result of these and other limitations, attention has been focused upon alternative 3 in an effort to identify one or more techniques for shielding the surface of the integrated circuit from the alpha particles generated within the package material itself.

In general, surface shielding has taken one of two forms: (1) a preformed tape of a suitably dense flexible material, such as polyimide, which can be adhered to the active surface of the integrated circuit prior to packaging; and (2) a liquid material, such as a liquid polyimide precursor compound, which is dispensed upon the active surface of the die and allowed to spread over the critical area and then cured prior to packaging. Development of the tape process has been severely impacted by the difficulty in physically attaching the tape to the integrated circuit die without damaging either the die, the tape or the wire bonds connecting the circuit to the adjacent portions of the lead frame, and by difficulty in achieving consistant adhesion between the tape and the die so as to preclude separation during and after packaging. With respect to the liquid coating process, problems include poor coating to die surface adhesion as a result of improper formulation or contaminated die surfaces, insufficiently thick coating after curing to intercept alpha particles, and excessively thick coatings after curing resulted in shrink-induced separation or damage to the wire bonds or to die itself. However, at least one manufacturer, Hitachi Semiconductor Division of Japan, is currently marketing 64 K memory devices having a polyimide coating applied by a proprietary process using a liquid polyimide precursor compound currently marketed by the Hitachi Chemical Company of Japan. However, the Hitachi Chemical Company polyimide compound, while generally suitable for use in side braze packages, is generally unsuitable for use in hermetic cerdip packaging due to the intolerance of the required seal temperatures and the tendency to generate intolerable levels of internal cavity moisture. In addition, Hitachi Chemical Company offers no polyimide compound suitable for use of an integrated circuit die to be plastic encapsulated.

SUMMARY OF THE INVENTION

Accordingly, it is an object of the present invention to provide a method for providing alpha particle protection for an integrated circuit die to be encapsulated in side braze, cerdip or plastic, as desired.

Another object of the present invention is to provide a method for dispensing a selected quantity of a liquid polyimide compound to provide alpha particle protection for an integrated circuit die.

These and other objects of the present invention are achieved in a method for providing alpha particle protection for an integrated circuit die which has been mounted on and electrically connected to a suitable lead frame, comprising the steps of: depositing a selected quantity of a liquid polyimide precursor compound having a predetermined solids content and viscosity on the active surface of the die to form a liquid polyimide precursor coating thereon; curing the coating for a first time period at a temperature selected to reduce the volatile content thereof below a predetermined level, and then for a second time period at a temperature selected to substantially complete the imidization thereof and the removal of the remaining volatile content thereof; and, substantially immediately prior to encapsulating the coated die and selected adjacent portions of the lead frame, dehydrating the coating for a third time period at a temperature selected to remove moisture absorbed by the coating since the curing thereof if a significant period of time has elapsed since the curing of the coating.

To achieve a coating of consistent thickness, a method is provided for dispensing a selected quantity of the liquid coating material onto the active surface of the integrated circuit die, comprising the steps of: subjecting to a substantially constant, predetermined pressure a quantity of a liquid polyimide precursor compound having a predetermined solids content and viscosity;

and then directing for a predetermined length of time a portion of said compound through a conduit of predetermined cross-sectional area onto said surface.

DESCRIPTION OF THE DRAWING

The single FIGURE illustrates the several steps comprising the method of the subject invention.

DESCRIPTION OF THE PREFERRED METHOD

In the development of the preferred method of the subject invention, considerable testing was done in order to determine the minimum thickness below which protection against the alpha particle radiation is insufficient to ensure that alpha particle induced soft errors during operation of the protected integrated circuit remained below a specified limit. In general, this minimum thickness is a function of the sensitivity of the integrated circuit to be protected, the selected soft error tolerance limit, the flux density and energy distribution of the alpha particle radiation emanating from the packaging materials, and the resistivity of the selected coating material after curing to the passage of alpha particles therethrough. For example, using the 64 K dynamic RAM integrated circuit commercially available from Motorola in a plastic package as part no. MCM6665AP, the Dupont polyimide precursor commercially available as Pyralin PI2562 satisfies a soft error tolerance limit of 1 failure in 10,000 hours with a minimum thickness of 1 mil. However, testing of cured coatings of other polyimide precursor compounds have been shown to exhibit similar alpha radiation shielding properties. While in general, coatings thicker than the minimum thickness provide extra insurance against alpha particle induced soft errors, shrinkage of the coating during the curing process may exert sufficient stress upon the die to cause wire bond separation or, under extreme circumstances, die shear or coating separation. Tests have shown that a maximum thickness of the cured coating of the order of about 10 mils should preclude such damage.

Having established a minimum and a maximum thickness goal for the cured coating appropriate for providing the desired level of alpha particle protection for a particular integrated circuit die, the viscosity and solids contents of an appropriate liquid polyimide precursor compound must be selected, since each affects the volume of compound necessary to produce the desired coating. In general, the viscosity of the selected liquid polyimide precursor compound must be low enough so that, when dispersed on the active surface of the integrated circuit die, it will flow outward to the die edges and completely cover the active surface. On the other hand, the viscosity must not be so high that the polyimide precursor compound will flow over the edges of the die, possibly contaminating other portions of the die assembly. Within these broad guidelines, a viscosity of the order of between about 75 and 200 centipoise has been found to be acceptable, although viscosities outside of this range may be acceptable from a functional standpoint in particular circumstances. While viscosity affects the surface coverage characteristic of the liquid polyimide precursor compound, the solids content or percent of solids in the compound tends to affect the cross sectional configuration of the final cured coating. For example, liquid polyimide precursor compounds containing less than about 15 percent solids have been found to produce a cured coating having a concave profile, thus undesirably thinning the cured coating over the central portions of the integrated circuit die. On the other hand, a liquid polyimide precursor compound having a solids content above about 30 to 37 percent tends to a viscosity higher than desired, thus requiring such a large amount of liquid material to completely cover the die that the resulting coating is excessively thick. As a result, the mismatch of the coefficients of thermal expansion between the die and the coating often generates shear stress between the die and the coating sufficient to cause delamination or die fracture. Thus, a suitable liquid polyimide precursor compound will have a percents solids between about 20 and 30 percent and, preferably, between about 24 and 27 percent.

An initial estimate of the volume of the selected liquid polyimide precursor compound required to provide the desired cured coating thickness may be computed in a conventional manner using the solids/solvents ratio of the selected compound and the active surface area of the integrated circuit die to be protected. Using this estimate as the starting point, more accurate determinations of the required volume can be empirically determined using the actual die and curing process. Recalibration for the particular die should thereafter be necessary only if the composition of the selected compound varies or if the curing process is modified.

In the preferred process for practicing the present integrated circuit protection method shown in the FIGURE, a precision fluid dispensing system 10 of the pneumatic type is employed. In the system 10, a controller 12 is coupled in a conventional manner to a compressed air source (not shown) and to an alternating current source (not shown). In operation, the controller 12 applies a substantially constant pressure selected via a pressure control knob 14 to a reservoir 16 containing a quantity of the selected liquid polyimide precursor compound. In response to the actuation of an operator footswitch 18, the controller 12 enables a metering head 20 to pass the pressurized polyimide precursor compound from the reservoir 16 to a hand-held dispenser 22 for a period of time determined by a cycle time control knob 24. One such precision fluid dispensing system 10 suitable for practicing the present method is the model 280J commercially available from the Tridak Division of Indicon Inc., Secor Road, Brookfield Center, Conn. 06805.

To calibrate the selected dispensing system 10, the pressure control knob 14 is set within the operating range of the controller 12 to suit the viscosity of the selected liquid polyimide precursor compound. The cycle time control knob 24 is then varied until the required volume is dispensed via the metering head 20. Periodically, the accuracy of the volume dispensed by the dispensing system 10 can be quickly verified by inserting the dispensing needle portion of the dispenser 22 into a short section of tubing 26 having substantially the same inner diameter as the outer diameter of the dispensing needle. The resulting length of the column of liquid polyimide precursor injected into the tubing 26 will then be equal to the polyimide precursor actually dispensed divided by the cross-sectional area of the tubing 26. This "gauge" length can be quickly verified using a ruler 28 or the like.

The present method is preferably performed after a given integrated circuit die 30 has been mounted for packaging, such as on the flag 32 of a conventional lead frame 34, and electrically connected to the appropriate conductor leads 36 via bonding wires 38. The dispensing system 10 can then be selectively actuated via the operator footswitch 18 to deposit the selected quantity of the liquid polyimide precursor compound on the active surface of the die 30 to form a liquid polyimide precursor coating 40a thereon. The die assembly is then placed in an oven 42a and heated to a temperature selected to reduce the solvent content of the coating 40a sufficiently slowly to preclude the formation of significant gas bubbles therein. For example, an upper temperature limit for this "low temperature cure" suitable for the PI2562 polyimide precursor has been found to be between about 100° C. and 150° C. However, it is deemed preferable to operate the oven 42a somewhat below the particular upper temperature limit to minimize the likelihood of bubble generation, even though to do so may extend slightly the low temperature curing time. This low temperature cure should be continued until at least about 95% of the solvent content of the coating 40a has been driven off, typically between about 1 and 4 hours. It has been discovered that the temperature of the oven 42a should be ramped from about ambient up to the selected low cure temperature, in order to minimize the likelihood of delamination of the coating 40a during the subsequent high temperature cure thereof. This can be accomplished directly by using a suitably equipped oven 42a or indirectly by simply overloading an oven 42a capable of bringing the overload up to the desired temperature within about 15 to 30 minutes of loading. One oven found particularly well suited for performing the low temperature cure using the latter indirect ramping technique is the Model 5851 commercially available from the National Appliance Company of Portland, Oreg.

After the low temperature cure, the partially cured coating 40b is then raised to a temperature selected to substantially complete the imidization thereof and the removal of the remaining solvent content thereof and the water molecules released during the imidization process. The lower temperature limit for this "high temperature cure" should be sufficient to sustain the imidization process, while the upper temperature limit is generally dictated by the tolerance of the die assembly. A suitable temperature for performing this high temperature cure for the PI2562 polyimide precursor is between about 250° C. and 450° C., and preferably between about 300° C. and 350° C. A curing time between about 1 and 4 hours has been found suitable when using the latter preferred temperature range. Although the oven 42b used to perform the high temperature cure may be the same as the oven 42a used to perform the low temperature cure, the time consumed in temperature ramping may be saved by using different ovens. An oven found suitable for performing the high temperature cure is the model POM256-B.1 commercially available from the Blue M Electric Company of Blue Island, Ill.

To facilitate the removal of all of the solvents from the coating 40a-40b, each of the ovens 42a and 42b should be plumbed with nitrogen ($N_2$) so that a flow of dry nitrogen can be maintained therethrough during both the low temperature cure and the high temperature cure. However, if the die assembly is of the ceramic type and the selected high cure temperature exceeds the melting point of the glass material in the package, dry filtered air is preferred rather than nitrogen in order to minimize migration of the lead plating material.

After the high temperature cure, the die 30 and particularly the coating 40c thereon, should be inspected to identify any significant mechanical defects in the die 30 or the coating 40c. Those die assemblies which exhibit die sheer or fracture, wire bond separation or shorting, or similar defects should be eliminated from further processing to minimize expense. Such an inspection should preferably be conducted under a laminar flow hood using a suitable microscope (not shown).

Although it is known that the cured polyimide coating 40c is hygroscopic, it has been discovered that the rate of moisture absorption following the high temperature cure proceeds surprisingly rapidly. Tests have shown that after only 2 hours following the high temperature cure, the coating 40c may absorb a sufficient amount of moisture from the ambient atmosphere to adversely affect the environment around the integrated circuit die 30 once packaged. Accordingly, in the preferred method, the coating 40c is dehydrated in an oven 42c at a temperature selected to remove any moisture absorbed by the coating 40c since the curing thereof, substantially immediately prior to the packaging of the coated integrated circuit die 30 whether in plastic as shown in the FIGURE, or in ceramic. For the PI2562 polyimide precursor, a dehydration temperature between about 280° C. and 450° C. has been found suitable, so long as the drying time is at least about 10 minutes. The oven model POM256-B.1 commercially available from the Blue M Electric Company has been found suitable for performing the pre-packaging dehydration of this coating 40c. As in the low temperature cure and the high temperature cure, it is preferred to provide a continuous flow of dry nitrogen, or air in the case of a ceramic package, through the oven 42c during the dehydration to insure rapid removal of the moisture driven out of the coating 40c.

Since many changes and modifications may be made to the several steps of the methods disclosed herein without departing from the spirit and scope of the present invention, it is therefore intended that the following claims cover all such changes and modifications.

I claim:

1. A method for providing alpha particle protection for an integrated circuit die which has been mounted for packaging and electrically connected to conductor leads integral with such packaging, comprising the steps of:

depositing a selected quantity of a liquid polyimide precursor compound having a predetermined solids content and viscosity on the active surface of the die to form a liquid polyimide precursor coating thereon;

curing the coating for a first time period at a first temperature selected to reduce the volatile content thereof below a predetermined level, and for a second time period at a second temperature selected to substantially complete the imidization thereof and the removal of the remaining volatile content thereof; and substantially immediately prior to packaging the coated die, dehydrating the coating for a third time period at a third temperature selected to remove moisture absorbed by the coating since the curing thereof.

2. The method of claim 1 wherein the step of curing the coating for a first time period is performed at a first temperature selected to reduce the volatile content thereof below said predetermined level sufficiently slowly to preclude the formation of significant gas bubbles therein.

3. The method of claim 2 wherein said first time period comprises until at least about 95% of the solvent content of said coating has been driven off.

4. The method of claim 1 or 2 further including the step of:
   inspecting the die and the coating thereon after the curing thereof to identify any significant mechanical defects in the die and coating; and
wherein the step of dehydrating the coating is performed after the inspection of the die and the coating thereon.

5. The method of claim 1 or 2 wherein the step of depositing said selected quantity of said liquid polyimide precursor compound comprises the steps of:
   subjecting to a substantially constant, predetermined pressure a quantity of said liquid polyimide precursor compound; and
   directing for a fourth predetermined length of time a portion of said compound through a conduit of predetermined cross-sectional area onto said surface.

6. The method of claim 5 including the further step of:
   periodically dispensing one of said portions of said compound into a length of tubing of predetermined cross-sectional area and verifying that the resulting length of the column of said compound in said tubing is substantially equal to a predetermined gauge length.

7. The method of claim 1 or 2 wherein said first temperature is selected between about 100° C. and 150° C.

8. The method of claim 1 or 2 wherein said second temperature is selected between about 250° C. and 450° C., and preferably, between about 300° C. and 350° C.

9. The method of claim 1 or 2 wherein the step of curing the coating is performed in a flow of dry nitrogen.

10. The method of claim 1 or 2 wherein the step of dehydrating the coating is performed in a flow of dry nitrogen.

11. The method of claim 1 or 2 wherein the liquid polyimide precursor compound has a solids content between about 20 and 30 percent, and preferably between about 24 and 27 percent.

12. The method of claim 1 or 2 wherein the liquid polyimide precursor compound has a viscosity of the order of between about 75 and 200 centipoise.

* * * * *